US011508779B2

(12) United States Patent
Kawaguchi

(10) Patent No.: US 11,508,779 B2
(45) Date of Patent: Nov. 22, 2022

(54) LIGHT EMITTING ELEMENT

(71) Applicant: NICHIA CORPORATION, Anan (JP)

(72) Inventor: Hirofumi Kawaguchi, Tokushima (JP)

(73) Assignee: NICHIA CORPORATION, Anan (JP)

(*) Notice: Subject to any disclaimer, the term of this patent is extended or adjusted under 35 U.S.C. 154(b) by 152 days.

(21) Appl. No.: 16/554,259

(22) Filed: Aug. 28, 2019

(65) Prior Publication Data
US 2020/0075666 A1 Mar. 5, 2020

(30) Foreign Application Priority Data
Aug. 30, 2018 (JP) .............................. JP2018-162087

(51) Int. Cl.
*H01L 27/15* (2006.01)
*H01L 33/12* (2010.01)
*H01L 33/20* (2010.01)
*H01L 33/62* (2010.01)
*H01L 33/38* (2010.01)
*H01L 33/44* (2010.01)
*H01L 33/50* (2010.01)
*H01L 33/32* (2010.01)

(52) U.S. Cl.
CPC .......... *H01L 27/156* (2013.01); *H01L 33/12* (2013.01); *H01L 33/20* (2013.01); *H01L 33/32* (2013.01); *H01L 33/387* (2013.01); *H01L 33/44* (2013.01); *H01L 33/502* (2013.01); *H01L 33/62* (2013.01)

(58) Field of Classification Search
CPC ..... H01L 27/156; H01L 33/32; H01L 33/502; H01L 33/387; H01L 33/62; H01L 33/20; H01L 33/44; H01L 33/12
See application file for complete search history.

(56) References Cited

U.S. PATENT DOCUMENTS

| 2004/0070053 A1* | 4/2004 | Ohara ................... H01L 21/306 257/E29.022 |
| 2008/0217414 A1 | 9/2008 | Ito |
| 2011/0210311 A1* | 9/2011 | Kim ....................... H01L 33/08 257/E33.012 |
| 2011/0210351 A1 | 9/2011 | Kim et al. |

(Continued)

FOREIGN PATENT DOCUMENTS

| JP | 2004-140029 A | 5/2004 |
| JP | 2008-208202 A | 9/2008 |

(Continued)

*Primary Examiner* — Vongsavanh Sengdara
(74) *Attorney, Agent, or Firm* — Foley & Lardner LLP

(57) ABSTRACT

A light emitting element includes: a Si substrate including: a first semiconductor layer, a plurality of light emitting layers arranged in a matrix on part of an upper surface of the first semiconductor layer, and a plurality of second semiconductor layers respectively disposed on upper surfaces of the light emitting layers; a first external connection part disposed on the Si substrate at a first end of the Si substrate in a longitudinal direction; a second external connection part disposed on the Si substrate at a second end of the Si substrate opposite to the first end in the longitudinal direction; and a plurality of wiring electrodes disposed on the Si substrate, the plurality of wiring electrodes including a first wiring electrode electrically connected to the first external connection part, and a second wiring electrode electrically connected to the second external connection part.

22 Claims, 12 Drawing Sheets

(56) References Cited

U.S. PATENT DOCUMENTS

| | | | |
|---|---|---|---|
| 2011/0297994 A1 | 12/2011 | Sugizaki et al. | |
| 2012/0241793 A1* | 9/2012 | In | H01L 33/486 438/22 |
| 2014/0070244 A1* | 3/2014 | Kim | H01L 33/08 257/89 |
| 2017/0040494 A1* | 2/2017 | Gim | H01L 33/382 |
| 2017/0301826 A1 | 10/2017 | Lee et al. | |
| 2019/0296204 A1* | 9/2019 | Oh | H01L 33/60 |

FOREIGN PATENT DOCUMENTS

| | | |
|---|---|---|
| JP | 2008-225592 A | 9/2008 |
| JP | 2011-181921 A | 9/2011 |
| JP | 2011-253999 A | 12/2011 |
| JP | 2013-048162 A | 3/2013 |
| JP | 2014-241397 A | 12/2014 |
| JP | 2017-195370 A | 10/2017 |

* cited by examiner

LIGHT EMITTING ELEMENT

CROSS-REFERENCE TO RELATED APPLICATION

This application claims priority to Japanese Patent Application No. 2018-162087, filed on Aug. 30, 2018, the disclosure of which is hereby incorporated by reference in its entirety.

BACKGROUND

The present disclosure relates to a light emitting element.

There has been proposed a flexible display formed of a flexible base member equipped with a thin film LED. Such flexible display is less likely to be broken when being bent, and thus is highly reliable (see Japanese Patent Publication No. 2008-225592).

SUMMARY

However, the thin film LED still may be broken if it receives great stress. That is, just reducing the thickness of the LED on the base member may not be enough to improve the reliability of the flexible display.

Accordingly, embodiments of the present disclosure are proposed.

According to one embodiment, a light emitting element includes an Si Substrate, a semiconductor layered body, a first external connection part, a second external connection part, a plurality of wiring electrodes. The Si substrate has, in a top view, a quadrangular shape that extends in a longitudinal direction and a lateral direction. The semiconductor layered body is formed of a nitride semiconductor includes a first semiconductor layer, a plurality of light emitting layers, and a plurality of second semiconductor layers. The first semiconductor layer has, in a top view, a quadrangular shape that extends in a longitudinal direction and a lateral direction, while being disposed over an entire upper surface of the Si substrate. The plurality of light emitting layers are arranged in a matrix on part of an upper surface of the first semiconductor layer. The plurality of second semiconductor layers are respectively disposed on upper surfaces of the light emitting layers. The first external connection part is disposed on one end in the longitudinal direction of the Si substrate. The second external connection part is disposed on the other end opposite to the one end. The wiring electrodes are disposed on the Si substrate. One of the wiring electrodes is electrically connected to one of the first external connection part. Other one of the wiring electrode is electrically connected to one of the second external connection part. The wiring electrodes include a first wiring part extending in the longitudinal direction of the Si substrate between two adjacent ones of the light emitting layers. The light emitting layers are electrically connected by the wiring electrodes in series, in parallel, or in a combination of series and parallel.

The above-described light emitting element includes a plurality of light emitting layers, and a region in which no light emitting layer is provided between the light emitting layers. This region in which no light emitting layer is provided can inhibit application of great stress onto the light emitting layers. This can provide a reliable light emitting element of which the light emitting layers are not easily broken when the whole light emitting element is bent.

DETAILED DESCRIPTION

Figure 1A:
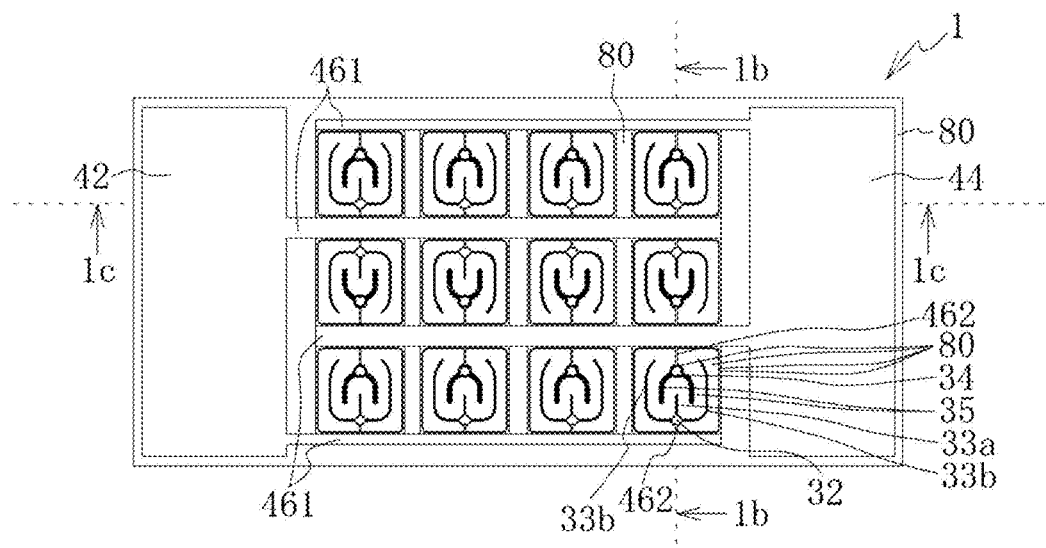
FIG. 1A is a schematic top view of a light emitting element according to an embodiment.

In the following, with reference to the drawings, a detailed description will be given of embodiments of the present disclosure. The embodiments described below are of an illustrative nature, and the invention is not limited to the following embodiments. In the following description, the terms referring to specific directions or positions (for example, "top/upper", "bottom/lower", and other words including such terms) may be used. These terms are used merely to clarify the relative directions or positions in any referenced drawings. The size, positional relationship and the like shown in the drawings may be exaggerated for the sake of clarity, and may not reflect the actual size or the actual scale among the constituent elements. For the sake of clarity, the drawings may have their aspect ratio adjusted as appropriate. For example, the lateral length of the whole light emitting element is actually greater in the cross-sectional view of FIG. 1C than in the cross-sectional view of FIG. 1B (see FIG. 1A). However, in the present disclosure, because FIG. 1B shows the whole light emitting element in an enlarged manner for easier understanding, the lateral length of the whole light emitting element is shown greater in FIG. 1B than in FIG. 1C.

Light Emitting Element 1

Figure 1B:
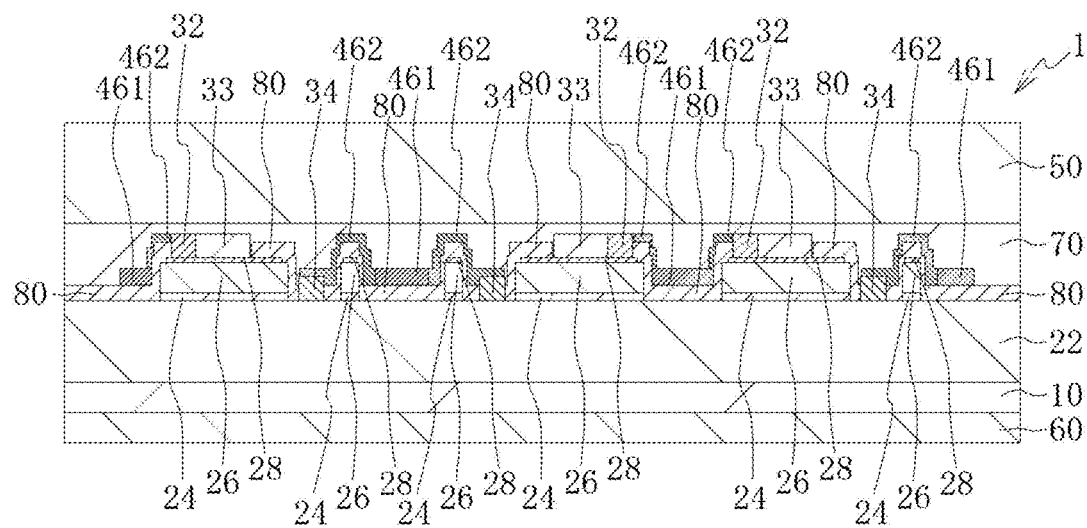
FIG. 1B is a cross-sectional view taken along line 1b-1b in FIG. 1A.
Figure 1C:
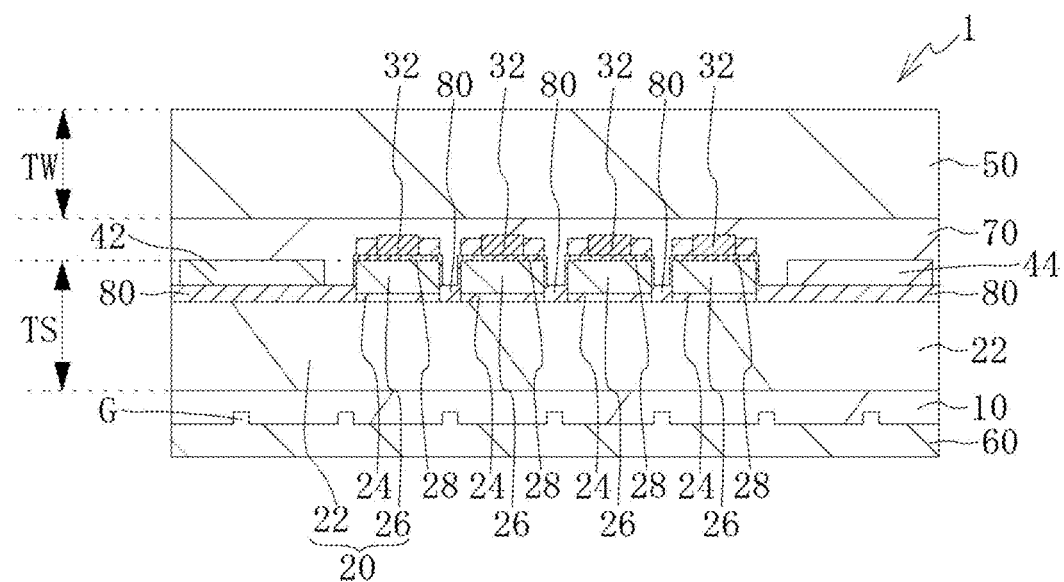
FIG. 1C is a cross-sectional view taken along line 1c-1c in FIG. 1A.
Figure 1D:
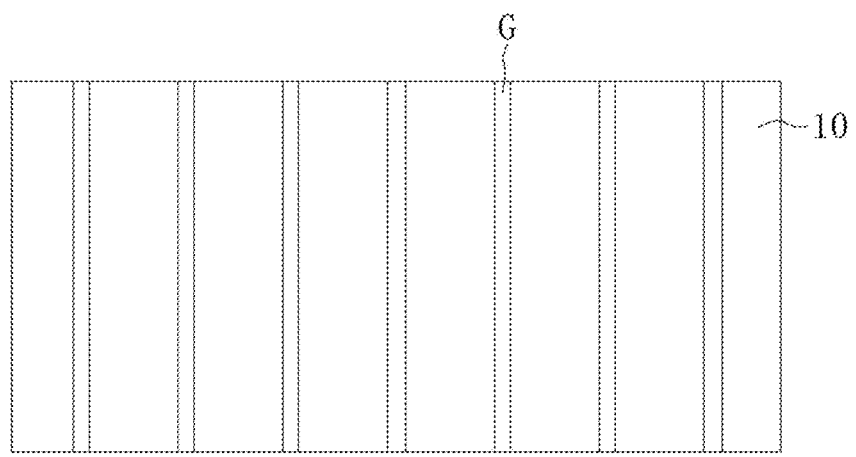
FIG. 1D is a schematic bottom view of the light emitting element according to the embodiment.

FIG. 1A is a schematic top view of a light emitting element according to an embodiment. FIG. 1B is a cross-sectional view taken along line 1b-1b in FIG. 1A. FIG. 1C is a cross-sectional view taken along line 1c-1c in FIG. 1A. FIG. 1D is a schematic bottom view of the light emitting element according to the embodiment. For ease of understanding, FIG. 1A does not show a wavelength conversion layer 50 and a bonding layer 70. FIG. 1D does not show a bonding layer 60. As shown in FIGS. 1A to 1D, a light emitting element 1 includes: a Si substrate, a semiconductor layered body, a first external connection part, a second external connection part, a plurality of wiring electrodes. The Si substrate 10 has, in a top view, a quadrangular shape that extends in a longitudinal direction and a lateral direction. The semiconductor layered body 20 is formed of a nitride semiconductor includes a first semiconductor layer 22, a plurality of light emitting layers 24, and a plurality of second semiconductor layers 26. The first semiconductor layer 22 has, in a top view, a quadrangular shape that extends in a longitudinal direction and a lateral direction, while being disposed over an entire upper surface of the Si substrate. The plurality of light emitting layers 24 are arranged in a matrix on part of an upper surface of the first semiconductor layer. The plurality of second semiconductor 26 layers are respectively disposed on upper surfaces of the light emitting layers 24. The first external connection part 42 is disposed on one end in the longitudinal direction of the Si substrate. The second external connection part 44 is disposed on the other end opposite to the one end. The wiring electrodes 46 are disposed on the Si substrate 10. One of the wiring electrodes 46 is electrically connected to one of the first external connection part 42. Other one of the wiring electrode 46 is electrically connected to one of the second external connection part 44. The wiring electrodes 46 include a first wiring part 461 extending in the longitudinal direction of the Si substrate 10 between two adjacent ones of the light emitting layers 24. The light emitting layers 24 are electrically connected by the wiring electrodes 46 in series, in parallel, or in a combination of series and parallel. In the following, a detailed description will be given of the members.

Si Substrate 10

The Si substrate 10 is a substrate formed using silicon (Si).

The Si substrate 10 has a quadrangular shape as seen in a top view having the longitudinal direction and the lateral direction. The Si substrate 10 having a quadrangular shape as seen in a top view can allow the whole light emitting element 1 to be easily bent, which facilitates mounting the light emitting element 1 on a curved surface. Preferably, a plurality of grooves G extending in the lateral direction of the Si substrate 10 is formed at the lower surface of the Si substrate 10. In this structure, the Si substrate 10 has a reduced thickness at the grooves G, the whole light emitting element 1 can be more easily bent, which facilitates mounting the light emitting element 1 on a curved surface.

The Si substrate 10 preferably has a thickness in a range of, for example, 10 μm to 400 μm, particularly 100 μm or less. The Si substrate 10 should have a thickness of 10 μm or more because an excessively reduced thickness will cause breakage of the Si substrate 10. The Si substrate 10 should also have a thickness of 400 μm or less so as to be flexible. In the range of 10 μm to 100 μm, the thickness of the Si substrate 10 is preferably in a range of 75 μm to 85 μm. Thus, the light emitting element 1 can be made to be durable and flexible. The thickness of the Si substrate 10 refers to the distance from the upper surface to the lower surface of the Si substrate 10.

Semiconductor Layered Body 20

The semiconductor layered body 20 includes the first semiconductor layer 22 disposed over the entire upper surface of the Si substrate 10. The first semiconductor layer 22 may be in contact with the Si substrate 10, or may be disposed on the Si substrate 10 via other member. The first semiconductor layer 22 has a quadrangular shape as seen in a top view having the longitudinal direction and the lateral direction. In addition to the Si substrate 10, the first semiconductor layer 22 may similarly have a quadrangular shape as seen in a top view. Accordingly, the whole light emitting element 1 is easily bent, thereby providing the light emitting element 1 easily mounted on a curved surface. The length in the longitudinal direction of the first semiconductor layer 22 is preferably in a range of 40 mm to 50 mm, and the width in the lateral direction of the first semiconductor layer 22 is preferably in a range of 10 mm to 20 mm. In such dimensions, the whole light emitting element 1 is easily bent in the longitudinal direction of the first semiconductor layer 22.

Figure 1E:
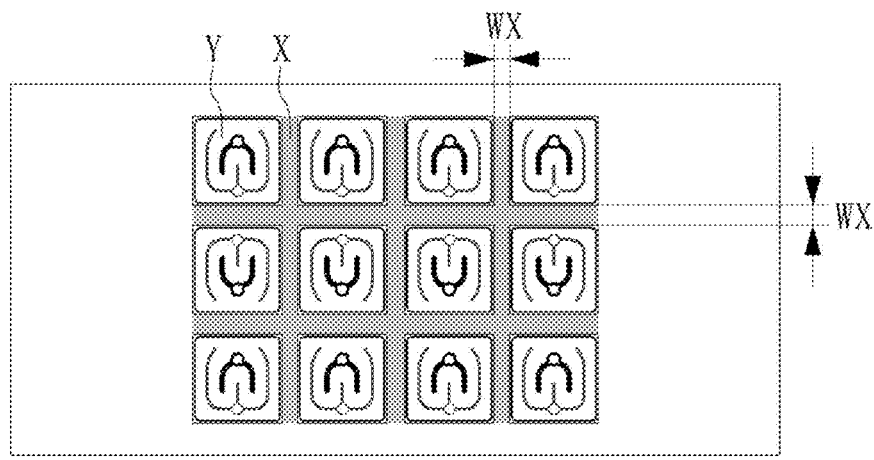
FIG. 1E is a schematic diagram of a region X where light emitting layer 24 is absent, and a region Y where light emitting layers 24 are disposed.

The semiconductor layered body 20 includes a plurality of light emitting layers 24 arranged in a matrix at part of the upper surface of the first semiconductor layer 22. The plurality of light emitting layers 24 are arranged in a matrix, a region X where the light emitting layer 24 is absent. The region X where the light emitting layer 24 is absent, (i.e., the region where the first semiconductor layer 22 is exposed) exists between the light emitting layers 24. The region X where the light emitting layer 24 is absent, and a region Y where the light emitting layers 24 are disposed, are schematically shown in FIG. 1E. The region X where the light emitting layer 24 is absent is shaded. This can attenuate application of great stress onto the light emitting layers 24. Here, as seen in a top view, the region X where the light emitting layer 24 is absent preferably has a grid-like shape in the upper surface of the first semiconductor layer 22. The region X where the light emitting layers 24 preferably has a width WX in a range of 1 μm to 20 μm in the upper surface of the first semiconductor layer 22, as seen in a top view. This structure can further effectively exhibit the function of reducing (attenuating) the stress in the region X where the light emitting layer 24 is absent, and the whole light emitting element 1 is further easily bent. With the region X having the width WX of 20 μm or less, when the light emitting element 1 is lit, the region X where a light emitting layer 24 is absent is less noticeable as seen in a top view (the region X does not emit light because of absence of the light emitting layers 24). The light emitting layers 24 may be in contact with the first semiconductor layer 22, or may be disposed on the first semiconductor layer 22 via other member.

The semiconductor layered body 20 includes a plurality of second semiconductor layers 26 respectively disposed on the upper surfaces of the plurality of light emitting layers 24. The second semiconductor layers 26 may be in contact with the light emitting layers 24, or may be disposed on the upper surfaces of the light emitting layers 24 via other member.

The semiconductor layered body 20, which includes the first semiconductor layer 22, the light emitting layers 24, and the second semiconductor layers 26, is formed of a nitride semiconductor ($In_xAl_yGa_{1-x-y}N$, $0≤X$, $0≤Y$, $X+Y≤1$). The semiconductor layered body 20 preferably has a thickness TS in a range of, for example, 5 μm to 10 μm. A semiconductor layered body 20 having a thickness of 5 μm or more can reduce the risk of breakage itself when the whole light emitting element 1 is bent. A semiconductor layered body 20 having a thickness of 10 μm or less can improve the flexibility of the whole light emitting element 1, thereby facilitating mounting the light emitting element 1 on a curved surface. The thickness TS of the semiconductor layered body 20 is the distance from the upper surface of the Si substrate 10 to the upper surfaces of the second semiconductor layers 26 in the top-bottom direction of the light emitting element 1.

Light-Transmissive Conductive Film 28

A light-transmissive conductive film 28 is provided substantially on the entire upper surface of each of the second semiconductor layer 26. The light-transmissive conductive film 28 transmits light from the light emitting layer 24. The light-transmissive conductive film 28 may be a metal oxide film such as ITO, for example. The light-transmissive conductive film 28 may have a thickness in a range of, for example, 10 nm to 300 nm.

First Electrode 32, Second Electrode 34

A first electrode 32 is provided on the upper surface of each of the second semiconductor layers 26. A second electrode 34 is provided on the upper surface of the first semiconductor layer 22. The first electrode 32 includes a first extending part 33 extending from the first electrode 32. The first extending part 33 includes an extending part 33a extending straight toward the second electrode 34, and extending parts 33b extending around the second electrode 34. The second electrode 34 includes second extending parts 35 extending from the second electrode 34 and positioned between the extending parts of the first electrode 32.

First External Connection Part 42, Second External Connection Part 44

The light emitting element 1 includes the first external connection part 42 disposed on one end in the longitudinal direction of the Si substrate 10, and the second external connection part 44 disposed on other end opposite to the one end. The first external connection part 42 and the second external connection part 44 are electrodes that supply electricity from outside to the light emitting element 1, and electrically connected to external electrodes. For example, when a positive electrode and a negative electrode serving as the external electrodes are provided on a curved surface on which the light emitting element 1 is mounted, the first external connection part 42 and the second external connection part 44 are respectively connected to these electrodes.

Wiring Electrodes 46

The light emitting element 1 includes a plurality of wiring electrodes 46 disposed on the Si substrate 10, and electrically connected to the first external connection part 42 or the second external connection part 44. The wiring electrodes 46 include the first wiring parts 461 extending in the longitudinal direction of the Si substrate 10 between two adjacent ones of the light emitting layers 24 out of the plurality of light emitting layers 24. The wiring electrodes 46 electrically connect between the first external connection part 42 or the second external connection part 44 and the plurality of light emitting layers 24. The plurality of light emitting layers 24 are electrically connected by the plurality of wiring electrodes 46 in series, in parallel, or in a combination of series and parallel. In the present embodiment, the light emitting layers 24 are connected in parallel. The wiring electrodes 46 may include a second wiring part 462 disposed on an insulating film 80 to extend from the first wiring part 461 in the lateral direction of the Si substrate 10. In this case, the insulating film 80 is provided at a region excluding part of the upper surface of the second semiconductor layer 26, and the second wiring part 462 is electrically connected to the first electrode 32 or the part of the upper surface of the second electrode 34.

Wavelength Conversion Layer 50

The light emitting element 1 may include a wavelength conversion layer 50 on a side corresponding to the upper surface of the second semiconductor layer 26. The wavelength conversion layer 50 may be formed of light-transmissive resin containing a fluorescent substance. When employing a blue light or ultraviolet light emitting element for the light emitting element 1, a YAG-based fluorescent material, a LAG-based fluorescent material, a TAG-based fluorescent material, a KSF-based fluorescent material, a β-sialon-based fluorescent material, a CASN-based fluorescent material, or a SCASN-based fluorescent material can be employed singly or two or more thereof in combination for the fluorescent substance. The light-transmissive resin may be formed of a light-transmissive material such as epoxy resin or silicone resin, or a mixture thereof, or glass. For example, a YAG-based fluorescent material that absorbs blue light and emits yellow light is employed as the fluorescent substance together with the light emitting layer 24 that emits blue light, in order to provide the light emitting element 1 emitting whit light. The wavelength conversion layer 50 preferably has a thickness TW that allows the wavelength conversion layer 50 to be bent following the curve of the Si substrate 10 and semiconductor layered body 20. For example, the thickness is preferably in a range of 1 mm to 3 mm.

As has been described above, in the light emitting element 1, a plurality of light emitting layers 24 are provided, and the region X where the light emitting layer 24 is absent is formed between the light emitting layers 24. This region X can attenuate application of great stress onto the light emitting layers 24 when the whole light emitting element 1 is bent. This can provide the reliable light emitting element 1 in which light emitting layers 24 are not easily broken when the whole light emitting element 1 is bent.

Method of manufacturing light emitting element 1 according to embodiment

With reference to FIGS. 2A to 9C, a description will be given of a method of manufacturing the light emitting element 1 according to the embodiment. For easier understanding, FIG. 9A does not show the wavelength conversion layer 50 and the bonding layer 70.

Figure 2A:
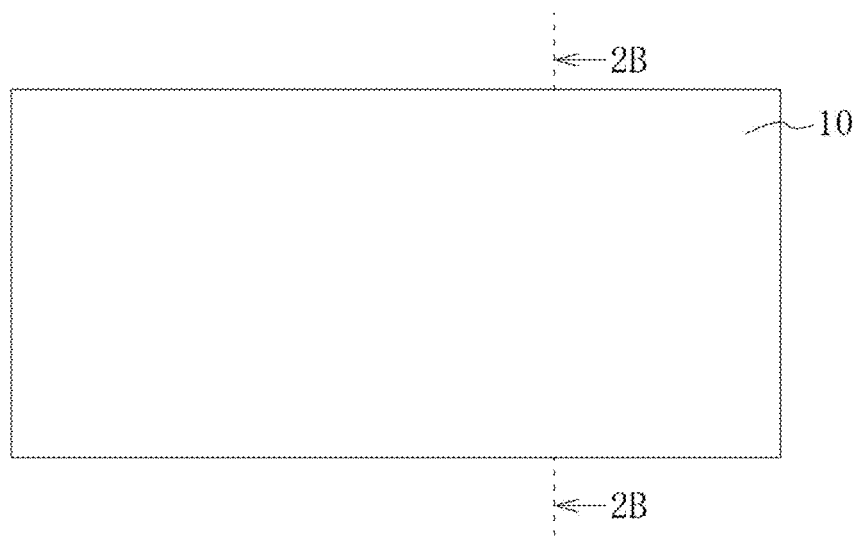
FIG. 2A is a schematic top view for describing a method of manufacturing the light emitting element according to the embodiment.
Figure 2B:
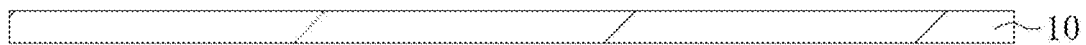
FIG. 2B is a cross-sectional view taken along line 2B-2B in FIG. 2A.
Figure 2C:
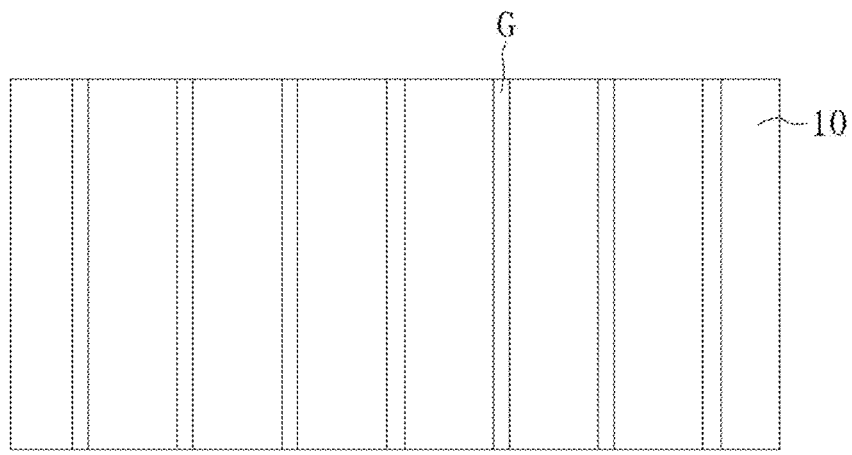
FIG. 2C is a schematic bottom view for describing the method of manufacturing the light emitting element.

As shown in FIGS. 2A, 2B, and 2C, the Si substrate 10 having, in a top view, a quadrangular shape that has the longitudinal direction and the lateral direction is provided. As shown in FIG. 2C, a plurality of grooves G extending in the lateral direction of the Si substrate 10 may be formed on the lower surface of the Si substrate 10.

Figure 3A:
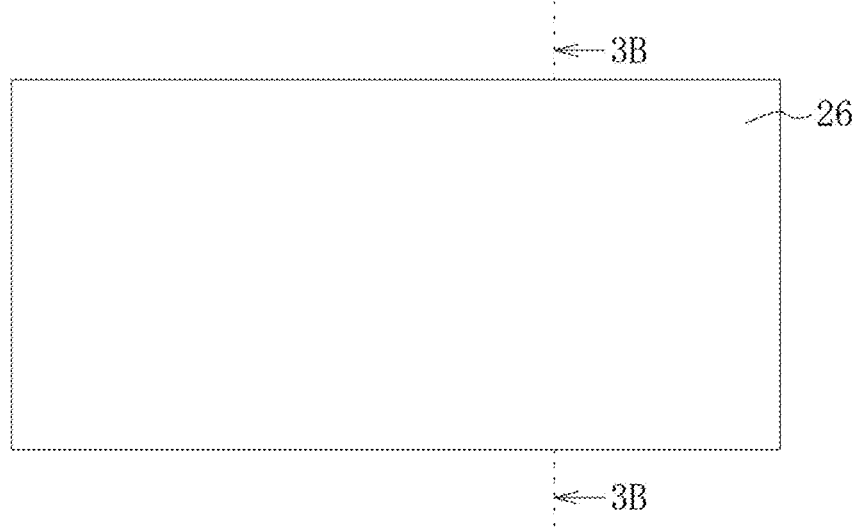
FIG. 3A is a schematic top view for describing the method of manufacturing the light emitting element according to the embodiment.
Figure 3B:
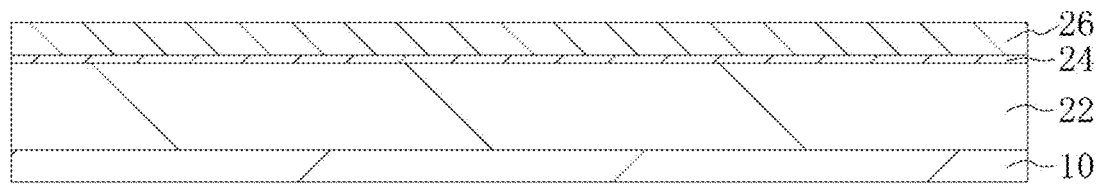
FIG. 3B is a cross-sectional view taken along line 3B-3B in FIG. 3A.

As shown in FIGS. 3A and 3B, the first semiconductor layer 22, the light emitting layer 24, and the second semiconductor layer 26 are disposed in this sequence on the entire upper surface of the Si substrate 10.

Figure 4A:
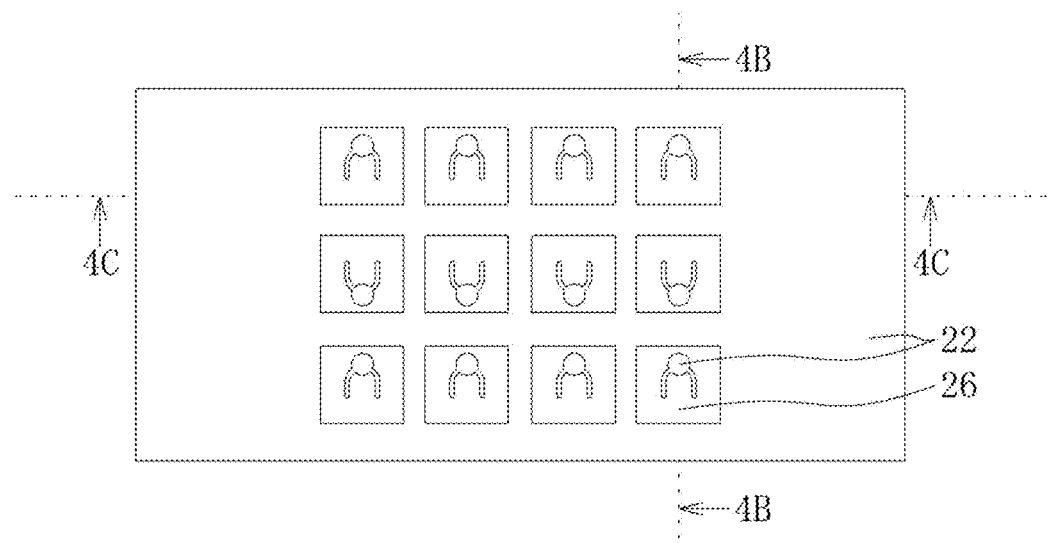
FIG. 4A is a schematic top view for describing the method of manufacturing the light emitting element.
Figure 4B:
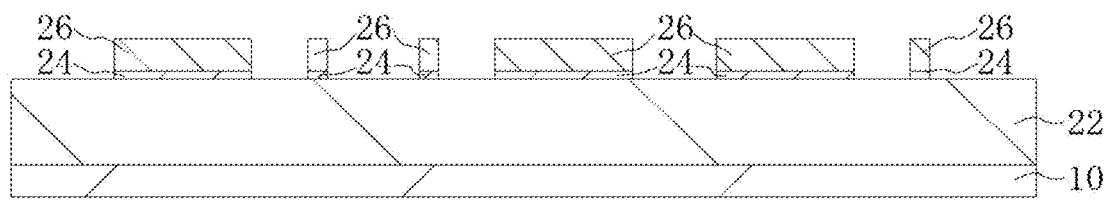
FIG. 4B is a cross-sectional view taken along line 4B-4B in FIG. 4A.
Figure 4C:
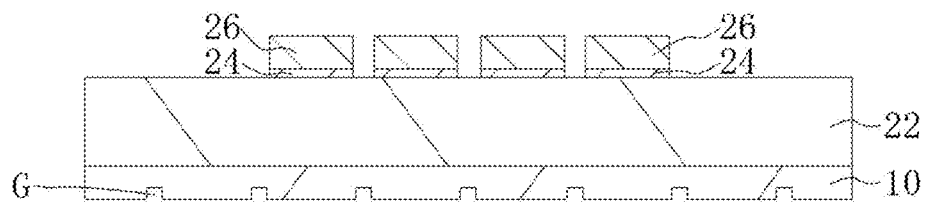
FIG. 4C is a cross-sectional view taken along line 4C-4C in FIG. 4A.

As shown in FIGS. 4A, 4B, and 4C, the light emitting layer 24 and the second semiconductor layer 26 provided on the upper surface of the first semiconductor layer 22 that has, in a top view, a quadrangular shape having the longitudinal direction and the lateral direction, are partially removed, to partially expose the upper surface of the first semiconductor layer 22. Thus, a plurality of light emitting layers 24 are arranged in a matrix on part of the upper surface of the first semiconductor layer 22. At the exposed part of the upper surface of the first semiconductor layer 22, the second electrode 34 is provided in a later process.

Figure 5A:
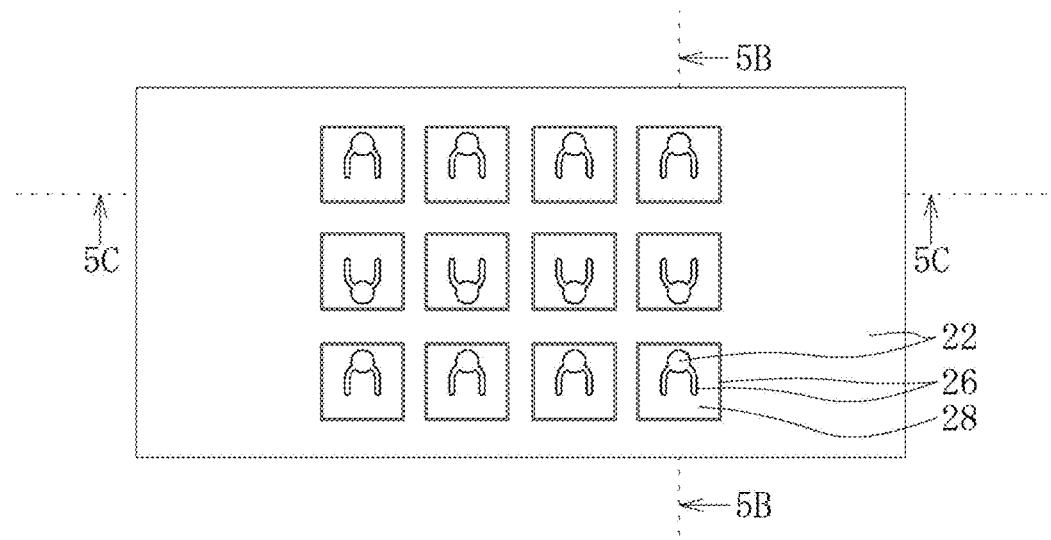
FIG. 5A is a schematic top view for describing the method of manufacturing the light emitting element according to the embodiment.
Figure 5B:
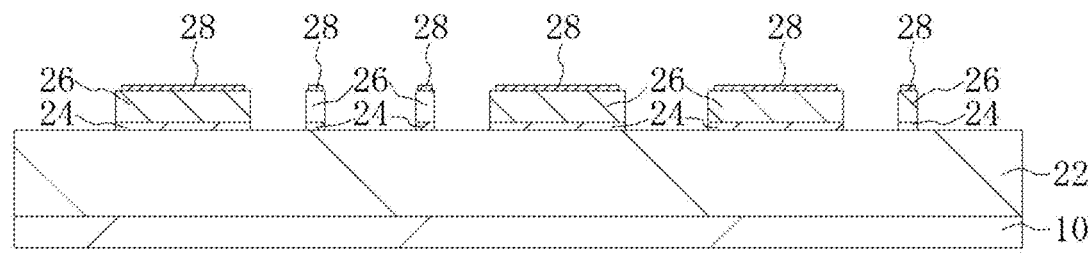
FIG. 5B is a cross-sectional view taken along line 5B-5B in FIG. 5A.
Figure 5C:
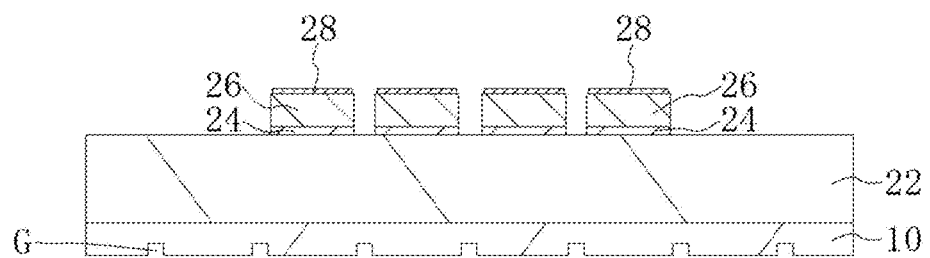
FIG. 5C is a cross-sectional view taken along line 5C-5C in FIG. 5A.

As shown in FIGS. 5A, 5B, and 5C, the light-transmissive conductive film 28 is provided at the upper surface of each second semiconductor layer 26.

Figure 6A:
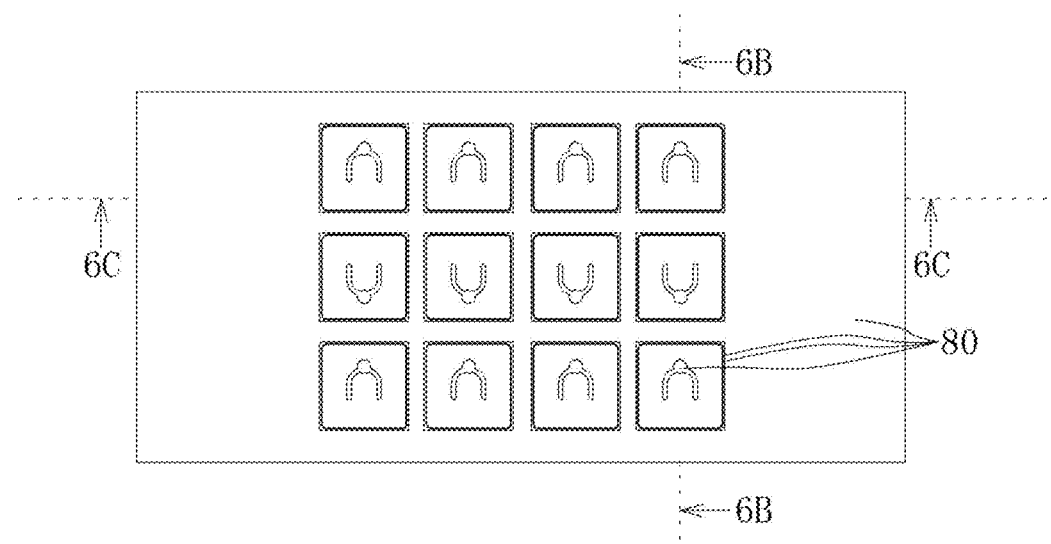
FIG. 6A is a schematic top view for describing the method of manufacturing the light emitting element according to the embodiment.
Figure 6B:
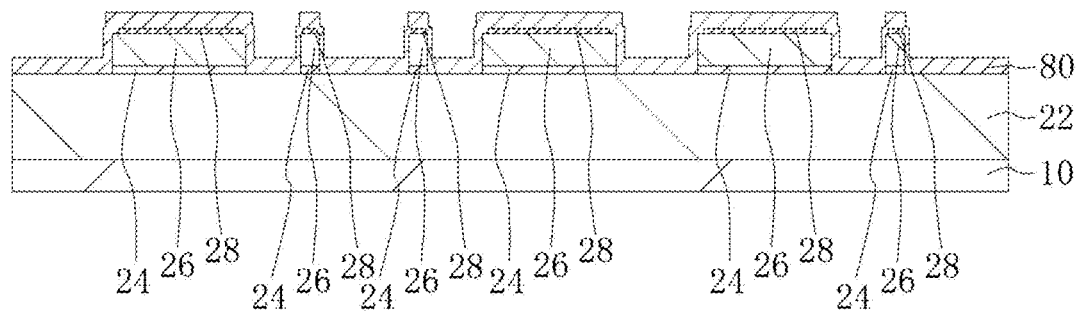
FIG. 6B is a cross-sectional view taken along line 6B-6B in FIG. 6A.
Figure 6C:
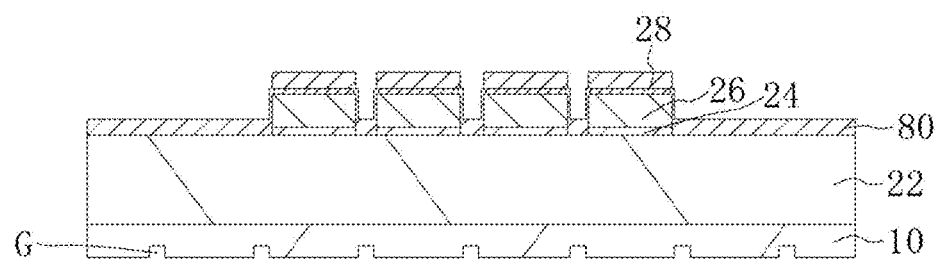
FIG. 6C is a cross-sectional view taken along line 6C-6C in FIG. 6A.

As shown in FIGS. 6A, 6B, and 6C, the insulating film 80 is provided on the upper surface of each of light-transmissive conductive films 28 and second semiconductor layers 26, and exposed part of the upper surface of the first semiconductor layer 22.

Figure 7A:
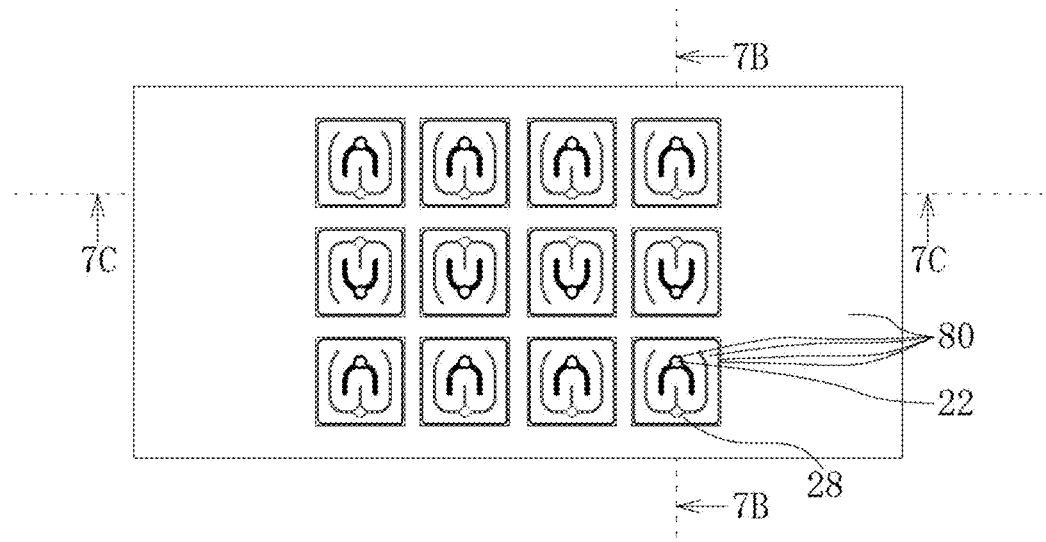
FIG. 7A is a schematic top view for describing the method of manufacturing the light emitting element according to the embodiment.
Figure 7B:
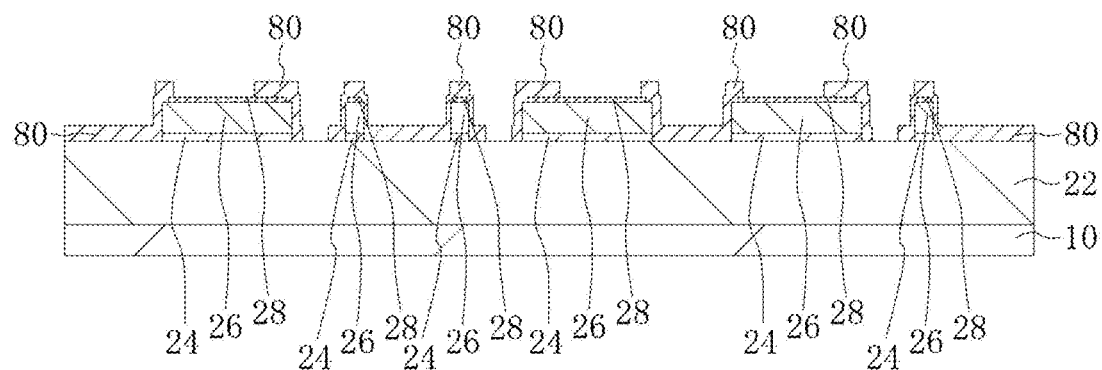
FIG. 7B is a cross-sectional view taken along line 7B-7B in FIG. 7A.
Figure 7C:
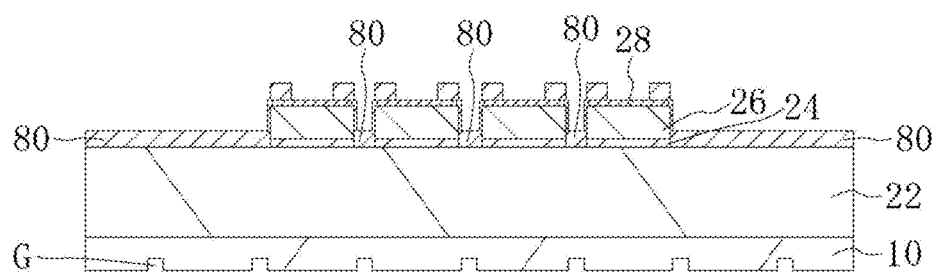
FIG. 7C is a cross-sectional view taken along line 7C-7C in FIG. 7A.

As shown in FIGS. 7A, 7B, and 7C, the insulating film 80 is partially removed, to partially expose the light-transmissive conductive film 28.

Figure 8A:
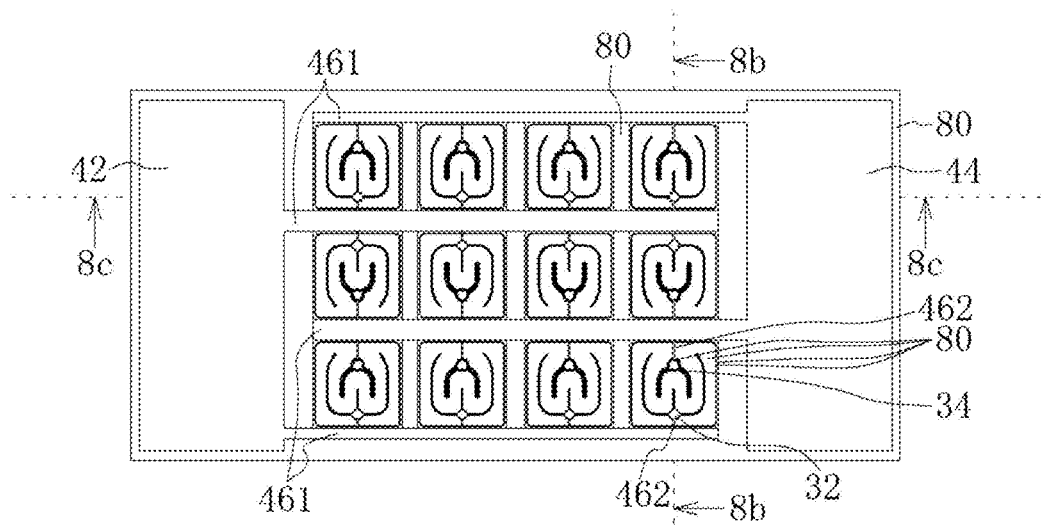
FIG. 8A is a schematic top view for describing the method of manufacturing the light emitting element according to the embodiment.
Figure 8B:
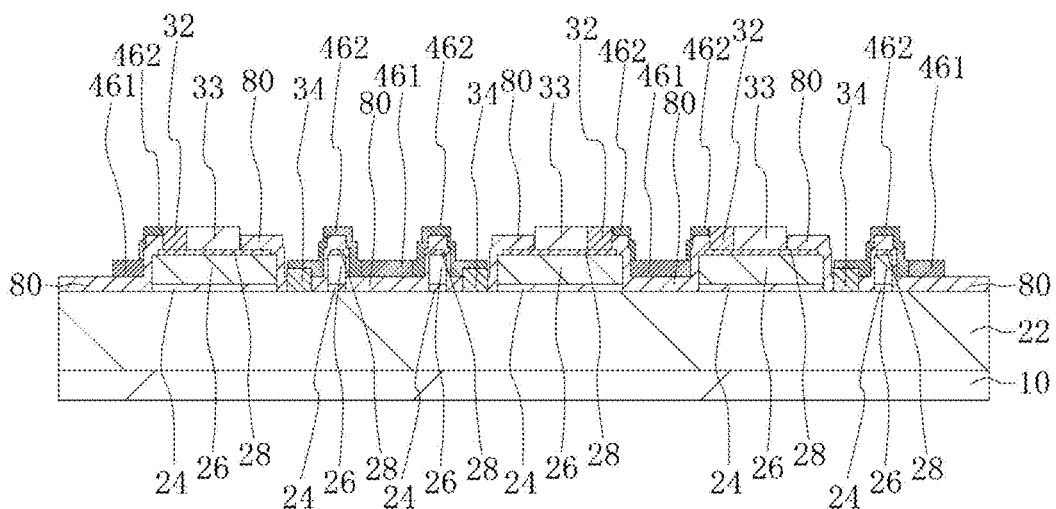
FIG. 8B is a cross-sectional view taken along line 8B-8B in FIG. 8A.
Figure 8C:
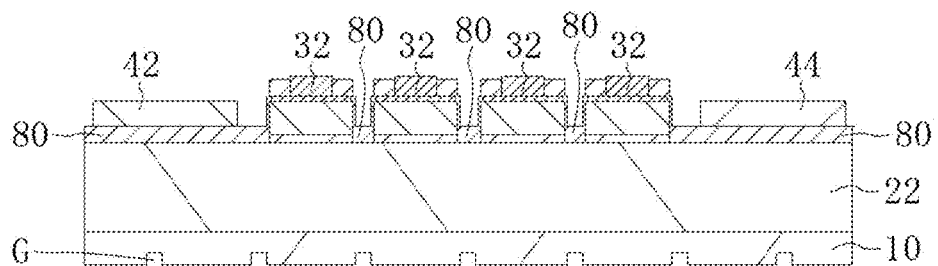
FIG. 8C is a cross-sectional view taken along line 8C-8C in FIG. 8A.

As shown in FIGS. 8A, 8B, and 8C, the first electrode 32 is provided on the upper surface of the light-transmissive conductive film 28, and the second electrode 34 is provided at the upper surface of the first semiconductor layer 22. The first external connection part 42 is provided at one end in the longitudinal direction of the Si substrate 10, and the second external connection part 44 is provided at the other end opposite to the one end. The wiring electrodes 46 including a plurality of first wiring parts 461 and the second wiring parts 462 are further provided. The first wiring parts 461 extend in the longitudinal direction of the Si substrate 10 respectively from the first external connection part 42 and the second external connection part 44 at the upper surface of the insulating film 80. The second wiring parts 462 extend in the lateral direction of the Si substrate 10 from the first wiring parts 461, so as to respectively be continuous to the first electrode 32 or the second electrode 34. The second wiring part 462 is provided on the insulating film 80, while positioning above the first semiconductor layer 22, the light emitting layer 24 and the second semiconductor layer 26. The first electrode 32, the second electrode 34, the first external connection part 42, the second external connection part 44, and the wiring electrodes 46 may be formed simultaneously.

Figure 9A:
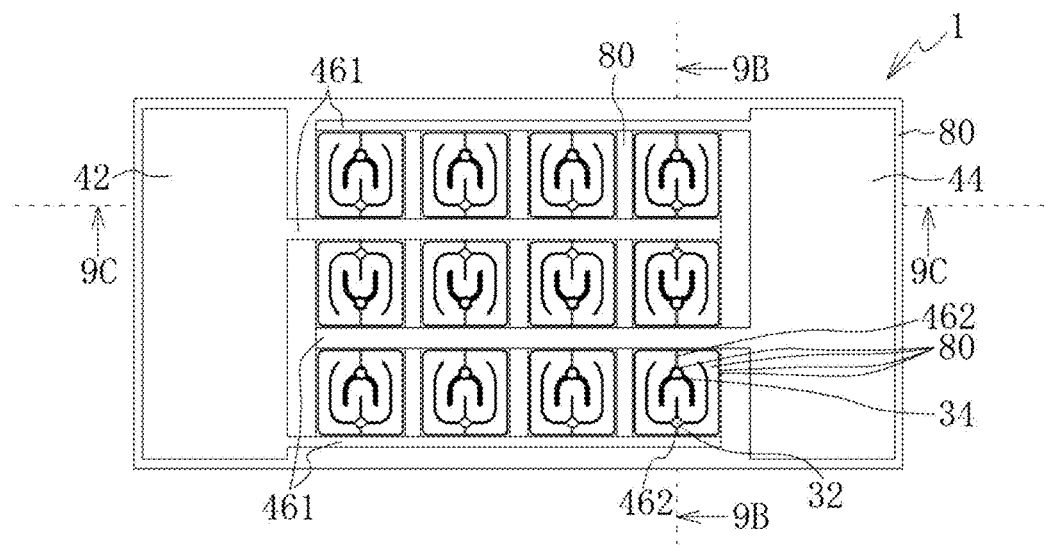
FIG. 9A is a schematic top view for describing the method of manufacturing the light emitting element according to the embodiment.
Figure 9B:
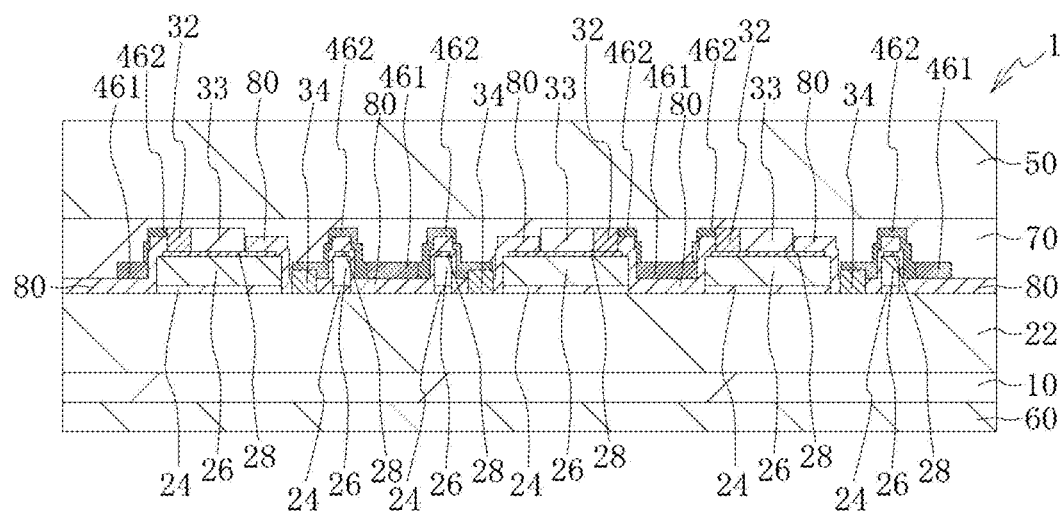
FIG. 9B is a cross-sectional view taken along line 9B-9B in FIG. 9A.
Figure 9C:
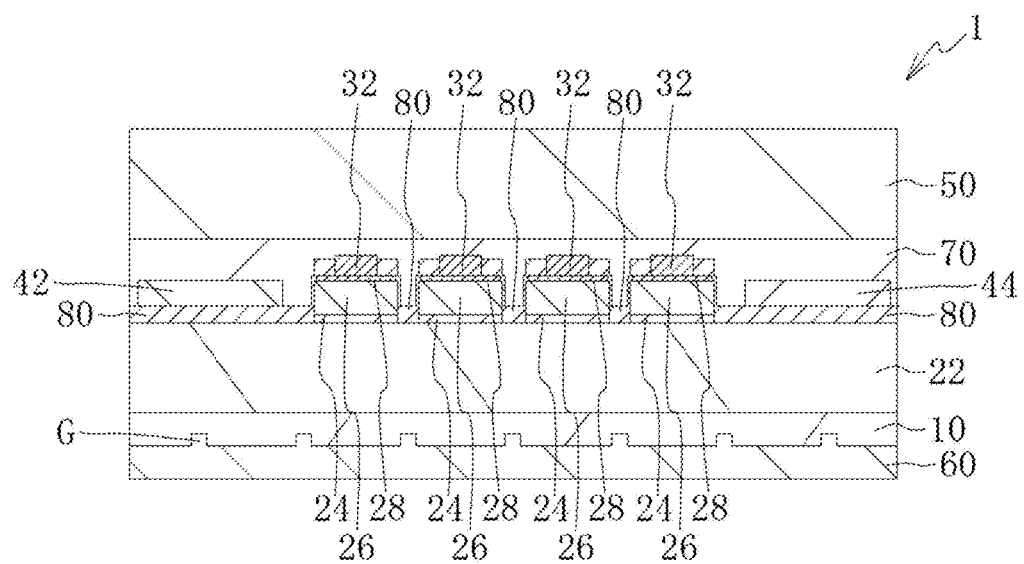
FIG. 9C is a cross-sectional view taken along line 9C-9C in FIG. 9A.

As shown in FIGS. 9A, 9B, and 9C, the wavelength conversion layer 50 is provided above the upper surfaces of the second semiconductor layers 26 via the bonding layer (the second bonding layer 70). In order to facilitate mounting the light emitting element 1 on a curved surface, a bonding layer (e.g., a first bonding layer 60) may be provided on the lower surface of the Si substrate 10.

Figure 10A:
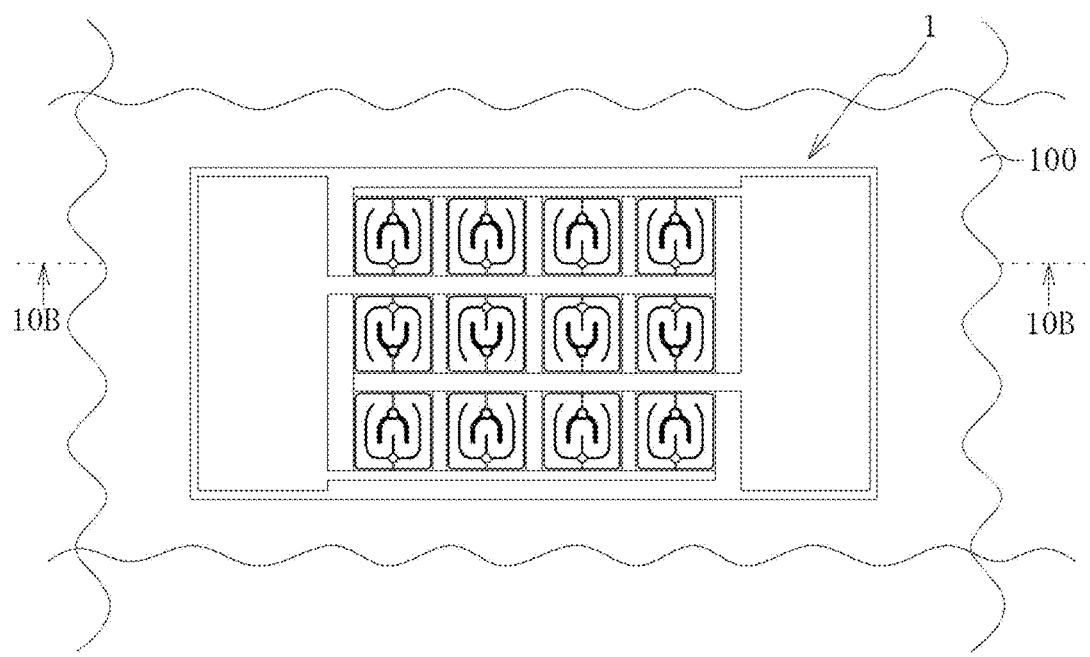
FIG. 10A is a schematic top view of the light emitting element according to the embodiment.
Figure 10B:
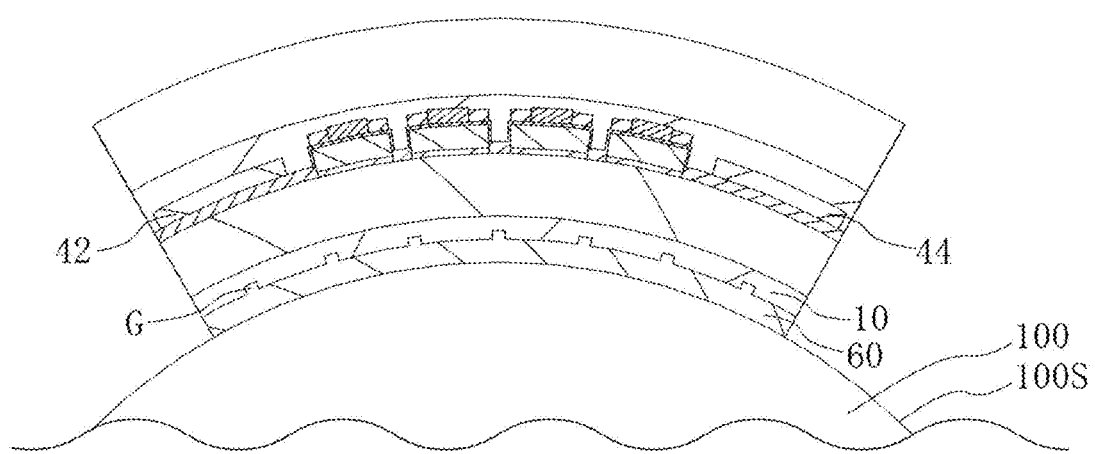
FIG. 10B is a schematic cross-sectional view of the light emitting element according to the embodiment.

FIG. 10A is a schematic top view of the light emitting element according to the embodiment being mounted on a base 100 having a curved surface 100S. FIG. 10B is a schematic cross-sectional view taken along line 10B-10B in FIG. 10A. As shown in FIGS. 10A and 10B, the Si substrate 10 is mounted on the curved surface 100S via the first bonding layer 60. The Si substrate 10 is mounted on the base 100 while being curved along the curved surface 100S that is curved in its longitudinal direction. The first external connection part 42 disposed on one end in the longitudinal direction of the Si substrate 10 is positioned at different plane from the second external connection part 44 disposed on other end opposite to the one end. The first external connection part 42 and the second external connection part 44 are positioned lower than the plurality of light emitting layers 24 of the light emitting element 1. This can reduce light absorption by the first external connection part 42 and the second external connection part 44, thereby improving the light extraction efficiency of the light emitting element 1.

The light emitting element 1 according to the embodiments described above is applicable to lighting devices, display devices, or the like. Such devices can be mounted on any object having a curved surface, such as a wall of a room, a post, a clock, a smartphone, a smartwatch, a laptop computer, or window glass.

What is claimed is:
1. A light emitting element comprising:
   a Si substrate having, in a top view, a quadrangular shape that extends in a longitudinal direction and a lateral direction, wherein the Si substrate is elongated in the longitudinal direction;
   a semiconductor layered body formed of a nitride semiconductor and including:
      a first semiconductor layer having, in a top view, a quadrangular shape that extends in the longitudinal direction and the lateral direction, and being disposed on an entire upper surface of the Si substrate,
      a plurality of light emitting layers that are separated from each other and arranged in a matrix of a plurality of rows and a plurality of columns on parts of an upper surface of the first semiconductor layer, and
      a plurality of second semiconductor layers respectively disposed on upper surfaces of the light emitting layers;
   a first external connection electrode disposed on the Si substrate at a first end of the Si substrate in the longitudinal direction;
   a second external connection electrode disposed on the Si substrate at a second end of the Si substrate opposite to the first end in the longitudinal direction; and
   a plurality of wiring electrodes disposed on the Si substrate, the plurality of wiring electrodes including a first wiring electrode electrically connected to the first external connection electrode, and a second wiring electrode electrically connected to the second external connection electrode; wherein:
   each of the wiring electrodes includes a first wiring part extending in the longitudinal direction of the Si substrate between two adjacent ones of the light emitting layers;
   the light emitting layers are electrically connected to each other; and
   wherein, in a top view, an entirety of each of the light emitting layers and an entirety of each of the second semiconductor layers are located in a region between the first external connection electrode and the second external connection electrode.

2. The light emitting element according to claim 1, further comprising:
an insulating film located at a region excluding part of an upper surface of each of the second semiconductor layers;
wherein each of the wiring electrodes includes a second wiring part disposed on the insulating film to extend from the first wiring part in the lateral direction of the Si substrate; and
wherein the second wiring part is electrically connected to said part of the upper surface of at least one of the second semiconductor layers.

3. The light emitting element according to claim 2, wherein a plurality of grooves extending in the lateral direction of the Si substrate are formed on a lower surface of the Si substrate that is opposite the upper surface of the Si substrate.

4. The light emitting element according to claim 2, wherein the upper surface of the first semiconductor layer has a region having a grid like shape where the light emitting layer is absent as seen in a top view.

5. The light emitting element according to claim 4, wherein a width of the region where the light emitting layer is absent as seen in the top view is a range of 1 μm to 20 μm.

6. The light emitting element according to claim 2, wherein
a length of the first semiconductor layer in the longitudinal direction is in a range of 40 mm to 50 mm; and
a width of the first semiconductor layer in the lateral direction is in a range of 10 mm to 20 mm.

7. The light emitting element according to claim 2, wherein a thickness of the semiconductor layered body is in a range of 5 μm to 10 μm.

8. The light emitting element according to claim 2, further comprising a wavelength conversion layer on a side corresponding to an upper surface of the second semiconductor layers.

9. The light emitting element according to claim 2, wherein a thickness of the Si substrate is 100 μm or less.

10. The light emitting element according to claim 1, wherein a plurality of grooves extending in the lateral direction of the Si substrate are formed on a lower surface of the Si substrate that is opposite the upper surface of the Si substrate.

11. The light emitting element according to claim 10, wherein the upper surface of the first semiconductor layer has a region having a grid like shape where the light emitting layer is absent as seen in a top view.

12. The light emitting element according to claim 10, wherein
a length of the first semiconductor layer in the longitudinal direction is in a range of 40 mm to 50 mm; and
a width of the first semiconductor layer in the lateral direction is in a range of 10 mm to 20 mm.

13. The light emitting element according to claim 10, wherein a thickness of the Si substrate is 100 μm or less.

14. The light emitting element according to claim 10, wherein the plurality of grooves includes a first groove that extends in the lateral direction on the lower surface of the Si substrate at a location below a region between the first external connection electrode and the light emitting layers.

15. The light emitting element according to claim 14, wherein the plurality of grooves includes a second groove that extends in the lateral direction on the lower surface of the Si substrate at a location below the first connection electrode.

16. The light emitting element according to claim 1, wherein the upper surface of the first semiconductor layer has a region having a grid like shape where the light emitting layer is absent as seen in a top view.

17. The light emitting element according to claim 16, wherein a width of the region where the light emitting layer is absent as seen in the top view is a range of 1 μm to 20 μm.

18. The light emitting element according to claim 1, further comprising a wavelength conversion layer on a side corresponding to an upper surface of the second semiconductor layers.

19. The light emitting element according to claim 1, wherein
a length of the first semiconductor layer in the longitudinal direction is in a range of 40 mm to 50 mm; and
a width of the first semiconductor layer in the lateral direction is in a range of 10 mm to 20 mm.

20. The light emitting element according to claim 1, wherein a thickness of the semiconductor layered body is in a range of 5 μm to 10 μm.

21. The light emitting element according to claim 18, wherein a thickness of the wavelength conversion layer is in a range of 1 mm to 3 mm.

22. The light emitting element according to claim 1, wherein a thickness of the Si substrate is 100 μm or less.

* * * * *